United States Patent
Wilcox et al.

(10) Patent No.: US 6,510,099 B1
(45) Date of Patent: Jan. 21, 2003

(54) MEMORY CONTROL WITH DYNAMIC DRIVER DISABLING

(75) Inventors: Jeffrey R. Wilcox, Hudson, OH (US); Opher D. Kahn, Zichron Yaakov (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/966,580

(22) Filed: Sep. 28, 2001

(51) Int. Cl.[7] ................................................. G11C 8/00
(52) U.S. Cl. ............................ 365/230.06; 365/189.05; 365/195
(58) Field of Search ....................... 365/189.05, 230.06, 365/233, 227, 195; 711/141, 154, 169

(56) References Cited

U.S. PATENT DOCUMENTS

| | | | |
|---|---|---|---|
| 5,798,969 A | * 8/1998 | Yoo et al. | 365/189.05 |
| 5,933,623 A | * 8/1999 | Umemura et al. | 713/400 |
| 6,182,177 B1 | * 1/2001 | Harriman | 710/112 |
| 6,212,611 B1 | 4/2001 | Nizar et al. | |

OTHER PUBLICATIONS

Intel Corporation; Intel 815 Chipset Family: 82815EP and 82815P Memory Controller Hub (MCH); Mar. 2001; 137 pages; ftp://download.intel.com/design/chipsets/datashts/29069302.pdf.

Micron Technology, Inc.; Double Data Rate (DDR) SDRAM MT46V2M32—512K x 32 x 4 banks; Rev. Mar. 2001; 64 pages; http://images.micron.com/pdf/datasheets/dram/2M32DDR-07.pdf.

Electronics Industries Alliance Jedec Solid State Technology Association; Double Data Rate (DDR) SDRAM Specification; JEDEC Standard No. 79; Jun. 2000; 77 pages; http://www.jedec.org/DOWNLOAD/jdec/JESD79R1.pdf.

Rambus Incorporated; Direct RDRAM 128/144–Mbit (256Kx16/18x32s); Document DL0059; Version 1.11; 66 pages; http://www.rambus.com/developer/downloads/rdram.128s0059–1.11.book.pdf.

Electronics Industries Alliance JEDEC Solid State Technology Division; Stub Series Terminated Logic for 2.5 volts (SSTL_2); JEDEC Standard No. 8–9; Sep. 1998; 21 pages; http://www.jedec.org/DOWNLOAD/jdec/JESD8–9.pdf.

Fairchild Semiconductor Corporation; AN–5016 Double Data Rate Support ICs; Dec. 2000; 9 pages; http://www-.fairchildsemi.com/an/AN/AN–5016.pdf.

* cited by examiner

*Primary Examiner*—Hoai Ho
*Assistant Examiner*—Gene N. Auduong
(74) *Attorney, Agent, or Firm*—Blakely, Sokoloff, Taylor & Zafman LLP (57) ABSTRACT

It is determined whether one or more memory devices coupled with each output of one or more output buffers by a terminated bus are in a first power state or a second power state. Each output buffer has a first impedance state and a second impedance state. The one or more output buffers are placed or maintained in the first impedance state in response to determining each of the one or more memory devices is in the first power state.

28 Claims, 5 Drawing Sheets

MEMORY CONTROL WITH DYNAMIC DRIVER DISABLING

FIELD OF THE INVENTION

The present invention relates to the field of computer systems. More particularly, the present invention relates to the field of memory control for computer systems.

BACKGROUND

The performance of a typical computer system is dependent on memory bandwidth, the speed at which a processor can access memory. The performance of mobile computer systems, however, is also dependent on power consumption which determines battery life. One common type of memory used in computer systems is synchronous data random access memory (SDRAM). The speed of SDRAM has increased substantially with the development of double data rate (DDR) SDRAM, which increases memory bandwidth by exchanging data on both rising and falling edges of a clock signal.

Because DDR SDRAM devices exchange data on both rising and falling edges of a clock signal, the frequency of signals on the interface lines has increased. As signal frequency increases, the likelihood of problems due to ringing and reflections on interface lines increases. As an example, reflections of a signal on a data line may result in erroneous data read from or written to a memory device. To ensure noise immunity and signal integrity on interface lines, DDR SDRAM devices utilize a terminated bus interface, called stub series terminated logic (SSTL).

DDR SDRAM devices are capable of being placed in a low power state by de-asserting a clock enable (CKE) signal to the devices. When the CKE signal is de-asserted, the devices draw less current, in part, by disabling input buffers for input signals except CKE and clock signals. In an effort to reduce power consumption, some mobile systems that use DDR SDRAM devices place the devices in a low power state when they are not accessed for a certain amount of time, thereby disabling input buffers for the devices. However, power is still consumed by the memory controller while a direct current (DC) voltage value is maintained on their inputs, due to termination requirements of SSTL. Because the DC voltage value on their inputs is not important when the input buffers are disabled, power consumed by the memory controller and termination resistors to maintain a valid DC voltage value is wasted.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

The following detailed description sets forth an embodiment or embodiments in accordance with the present invention for memory control with dynamic driver disabling.

In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

An Exemplary Mobile Computer System

Figure 1:
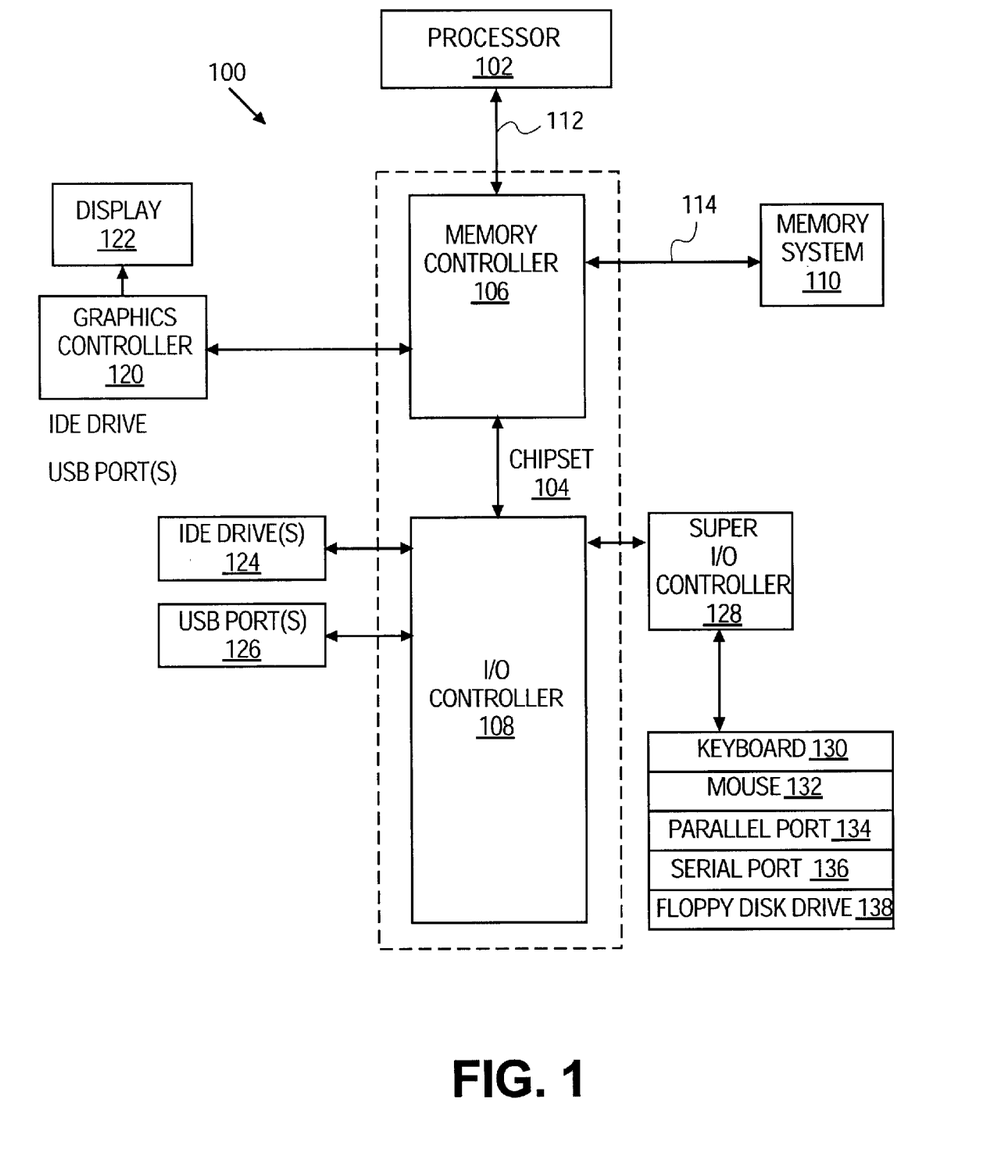
FIG. 1 illustrates a block diagram of an exemplary mobile computer system having a memory controller to perform dynamic driver disabling.

FIG. 1 illustrates an exemplary mobile computer system 100 to perform memory control with dynamic driver disabling. Although described in the context of mobile computer system 100, the present invention may be implemented in any suitable computer system, such as a desktop computer system, comprising any suitable one or more integrated circuits.

As illustrated in FIG. 1, mobile computer system 100 comprises a processor 102, a chipset 104, and a processor bus 112. Processor 102 and chipset 104 are coupled to processor bus 112. Processor 102 may comprise any suitable processor such as, for example, a processor in the Pentium® or Celeron® family of processors available from Intel® Corporation of Santa Clara, Calif.

Chipset 104, for one embodiment, comprises a memory controller 106 and an input/output (I/O) controller (IOC) 108. Memory controller 106 and IOC 108 may each comprise any suitable circuitry and, for one embodiment, are each formed as a separate integrated circuit chip. Chipset 104, for other embodiments, may comprise any suitable one or more integrated circuit devices.

Memory controller 106 may comprise any suitable interface controllers to provide for any suitable communication link to processor bus 112 and/or to any suitable device or component in communication with memory controller 106. Memory controller 106, for one embodiment, provides suitable arbitration, buffering, and coherency management for each interface.

Memory controller 106 is coupled to processor bus 112 and provides an interface to processor 102 over processor bus 112. Processor 102 may alternatively be combined with memory controller 106 to form a single chip. Memory controller 106, for one embodiment, also provides an interface to a memory system 110 and a graphics controller 120 each of which are coupled to memory controller 106. Memory system 110 is coupled to memory controller 106 by memory bus 114. Memory system 110 stores data and/or instructions for mobile computer system 100 and may comprise any suitable memory, such as double data rate (DDR) synchronous dynamic random access memory (SDRAM). Graphics controller 120 controls the display of information on a suitable display 122, such as a liquid crystal display (LCD) for example, coupled to graphics controller 120. Memory controller 106, for one embodiment, interfaces with graphics controller 120 through an accelerated graphics port (AGP). Graphics controller 120, for one embodiment, may alternatively be combined with memory controller 106 to form a single chip.

Memory controller 106 is also coupled to IOC 108 through an interface to provide access to IOC 108. IOC 108 provides an interface to I/O devices or peripheral components for mobile computer system 100. IOC 108 may comprise any suitable interface controllers to provide for any suitable communication link to memory controller 106 and/or to any suitable device or component in communication with IOC 108. IOC 108, for one embodiment, provides suitable arbitration and buffering for each interface.

For one embodiment, IOC 108 provides an interface to one or more suitable integrated drive electronics (IDE) drives 124, such as a hard disk drive (HDD) or compact disc read only memory (CD ROM) drive, to store data and/or instructions and one or more suitable universal serial bus (USB) devices through one or more USB ports 126. IOC 108, for one embodiment, also provides an interface through a super I/O controller 128 to a keyboard 130, a mouse 132, one or more suitable devices, such as a printer for example, through a parallel port 134, a suitable device through a serial port 136, and a floppy disk drive 138.

An Exemplary Memory Controller

Figure 2:
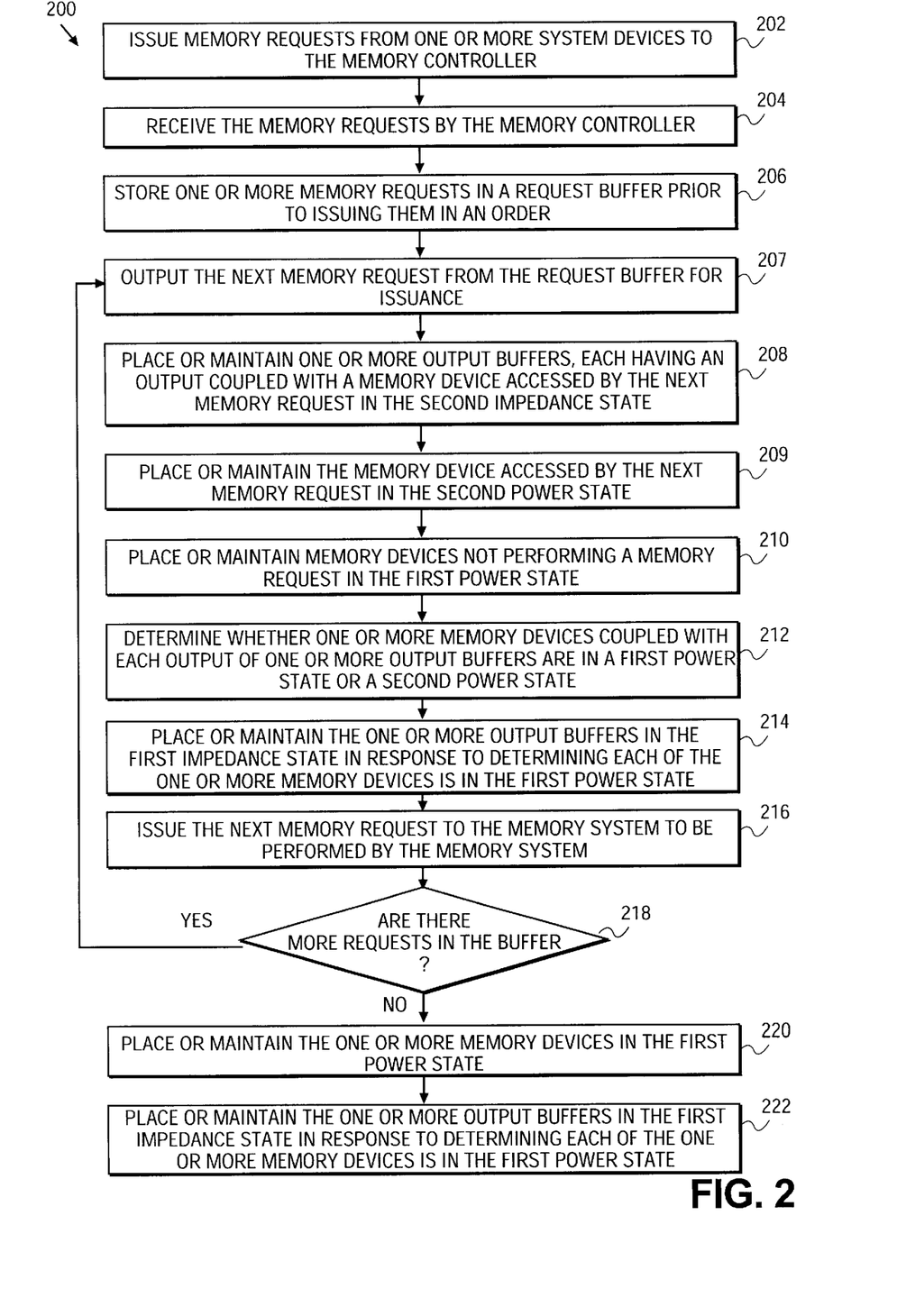
FIG. 2 illustrates, for one embodiment, a flow diagram of memory control with dynamic driver disabling.

The operation of one embodiment of memory control with dynamic driver disabling is illustrated in a flow diagram 200 of FIG. 2. In one embodiment, the operations of flow diagram 200 are performed by memory controller 106, as illustrated in FIG. 3.

Figure 3:
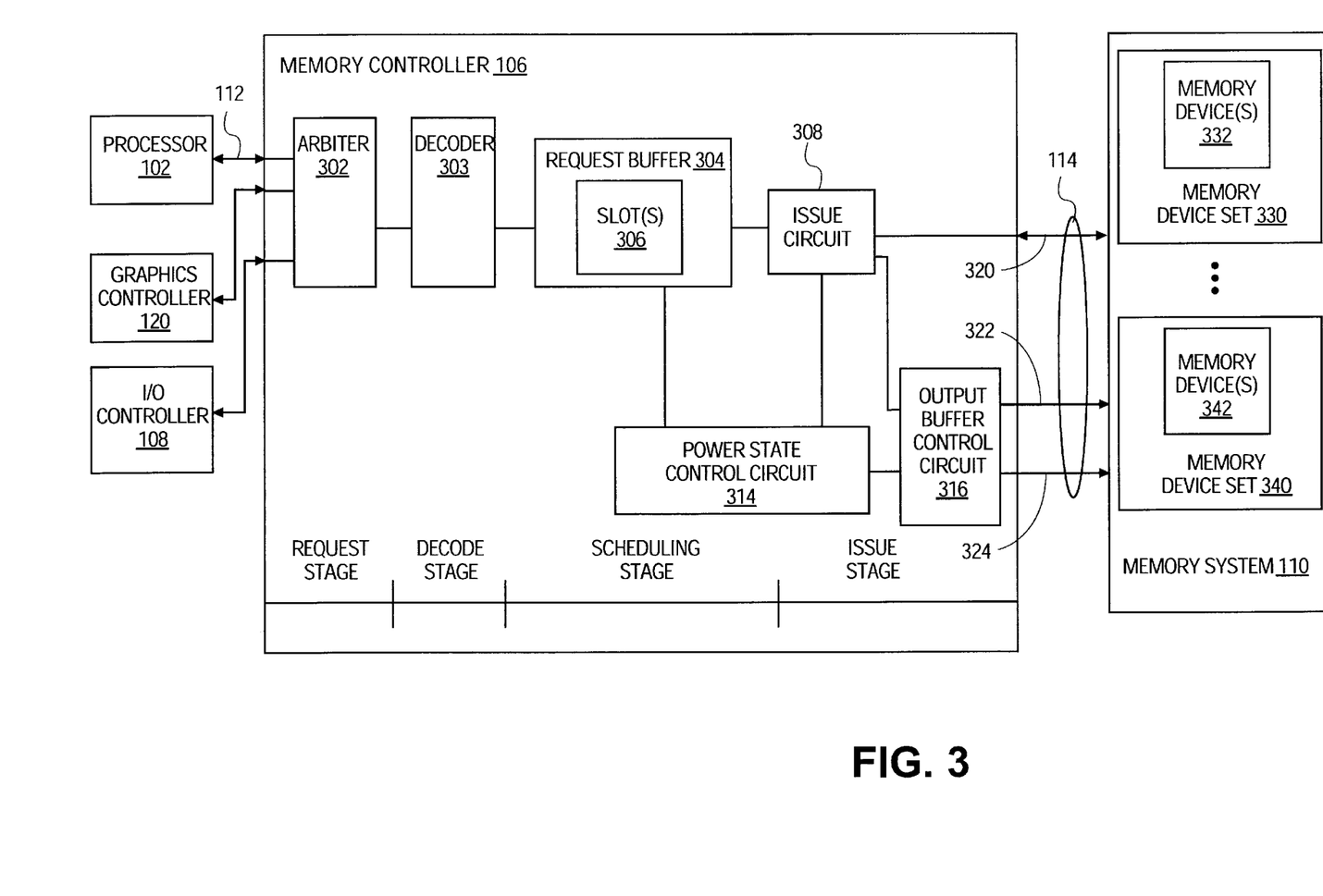
FIG. 3 illustrates, for one embodiment, a block diagram of a memory controller to perform dynamic driver disabling.

As illustrated in FIG. 3, one embodiment of memory controller 106 comprises an arbiter 302, a decoder 303, a request buffer 304, an issue circuit 308, a power state control circuit (PSCC) 314, and an output buffer control circuit (OBCC) 316. Each may comprise any suitable circuitry.

Memory controller 106 functions as an interface to memory system 110 for system devices, such as processor 102, graphics controller 120 and IOC 108. Memory controller 106 executes memory requests in a pipelined manner, which increases the throughput of processing memory requests.

As illustrated, in one embodiment, memory controller 106 receives a memory request with arbiter 302 in a request stage, decodes the memory request with decoder 303 in a decode stage, places the decoded memory request in request buffer 304 in a scheduling stage and issues the memory request to memory system 110 with issue circuit 308 in an issue stage.

Memory controller 106 is coupled to memory system 110 by memory bus 114. Memory bus 114 may comprise one or more terminated interface lines, each coupled with a termination voltage through a termination resistance. In one embodiment, memory bus 114 comprises data lines 320, address lines 322, and control lines 324. In other embodiments, additional types of bus lines may be provided to support additional memory features. Typically, data lines 320 are bi-directional lines, while address lines 322 and control lines 324 are outputs with respect to memory controller 106. As illustrated, in one embodiment, address and control line outputs are routed through OBCC 316.

Memory system 110 comprises one or more memory devices. As illustrated in FIG. 3, for one embodiment, memory system 110 may comprise one or more memory device sets, such as memory device sets 330 and 340, which may each comprise one or more memory devices, such as memory devices 332 and 342, respectively. While only two memory device sets are illustrated, it should be appreciated that more than two memory device sets may be supported by memory controller 106.

For one embodiment, memory system 110 may comprise memory device sets of one or more DDR SDRAM memory devices, commonly referred to as memory rows. Memory bus 114 may comprise a separate clock enable (CKE) line and a separate chip select (CS) line for each memory row, so that each memory device on a memory row shares a common CKE line and a common CS line. Other bus lines, such as data, address, and control lines, may be shared among multiple memory rows. For one embodiment, memory system 110 comprises memory rows of DDR SDRAM devices packaged as dual inline memory modules (DIMMs) of one or more memory rows per DIMM.

Referring now to flow diagram 200 of FIG. 2, for block 202, memory requests are issued from one or more system devices to memory controller 106. For example, a memory request may originate from processor 102, graphics controller 120, or IOC 108. The memory request may access a memory device in memory system 110, for example, to read data from or write data to the memory device.

For block 204, memory controller 106 receives the memory requests. Because more than one memory request may be received simultaneously, arbiter 302 determines an order of priority in the request stage before the memory request is passed on to the decode stage.

In one embodiment, arbiter 302 may implement a predetermined order of priority that gives memory requests from graphics controller 120 top priority, while memory requests from the processor 102 have second priority. As a result, if memory requests are received simultaneously from processor 102 and graphics controller 120, the memory request of graphics controller 120 would be processed first. Alternative embodiments may implement other techniques to arbitrate simultaneously received memory requests. As an example, arbiter 302 could be provided as an external device coupled between system devices and memory controller 106. In another embodiment, memory controller 106 may receive memory requests from only one device, such as processor 102, and may not comprise arbiter 302.

Decoder 303 in the decode stage decodes the arbitrated memory requests, which may be of any suitable format. For example, in one embodiment, decoder 303 decodes a memory request to determine the intended operation (e.g., read data or write data) of the memory request, the memory address of the memory request, and, if the memory request is a write request, data to be written to the accessed memory device. Thereafter, the decoded information is passed to the scheduling stage of memory controller 106.

The memory address provided with the memory request is, in part, dependent on the type of memory implemented in the system. For example, in an embodiment where memory system 110 comprises memory rows of DDR SDRAM memory devices, the decoded memory address information may include identification of the memory row containing the memory location to be accessed by the memory request, an identification of the memory page within the identified row, and a storage location within the identified row and page.

In another embodiment, memory requests are issued with a virtual address. In such an embodiment, additional circuitry is included to convert a virtual address to a real address prior to decoding the address as described above.

For block 206, one or more memory requests are stored in request buffer 304 prior to issuing them in an order. For one embodiment, request buffer 304 in the scheduling stage comprises one or more slots, such as slots 306, to store one or more decoded memory requests in a first-in-first-out (FIFO) manner.

In another embodiment, request buffer 304 is located before decoder 303, and stores memory requests that have not been decoded. For such an embodiment, decoder 303 may be located between request buffer 304 and issue circuit 308, so that memory requests are decoded as they are output from request buffer 304.

For block 207, the next memory request is output from request buffer 304 for issuance. In one embodiment, issue circuit 308 provides multiplexing/demultiplexing access to memory bus 114 during issuance of a memory request to memory system 110. As an example, if the memory request is a write request, issue circuit 308 may output address information to address lines 322, followed by data to be written to memory system 110 output to data lines 320.

If the memory request is a read request, issue circuit 308 may output address information to address lines 322 and then receive, as input, requested data that is output from memory system 110 to data lines 320. Memory controller 106 then outputs the requested data to the system device that issued the read request. While not illustrated in FIG. 3, memory controller 106 may comprise response circuitry to process a response from memory system 110. Such circuitry is well known in the art.

Memory system 110 may comprise memory devices having at least a first power state and a second power state. The first power state may correspond to a low power state, where input buffers of the memory devices are disabled, while the second power state may correspond to a normal operating power state where input buffers are enabled. Memory devices may also have one or more additional power states that may correspond to an even lower power state than the first power state. Such power states typically require a much greater latency period upon exit than the first power state, and would therefore typically be entered only on a system-wide low power state, such as a suspend operation.

PSCC 314 controls the power state of memory devices in memory system 110. For one embodiment, PSCC 314 may place or maintain in the second power state a memory device to be accessed by a memory request being issued based on signals generated by the issue circuit. For another embodiment, PSCC 314 may place or maintain in the second power state memory devices to be accessed by memory requests in request buffer 304.

For one embodiment, PSCC 314 may place or maintain DDR SDRAM memory devices that share a common CKE line within a memory row in the low power state by de-asserting a signal on the common CKE line. Because DDR SDRAM devices are coupled with memory controller 106 by a terminated bus, however, even if the memory devices are placed or maintained in the low power state, power may be dissipated through the terminated bus interface lines.

An Exemplary Terminated Interface

DDR SDRAM devices utilize stub series terminated logic (SSTL) for interface lines, such as data lines 320, address lines 322, and control lines 324, to ensure signal integrity and noise immunity. SSTL is optimized for the main memory system environment of a computer, which has long traces, or stubs, off the motherboard bus due to trace routing of standard memory modules.

Figure 4:
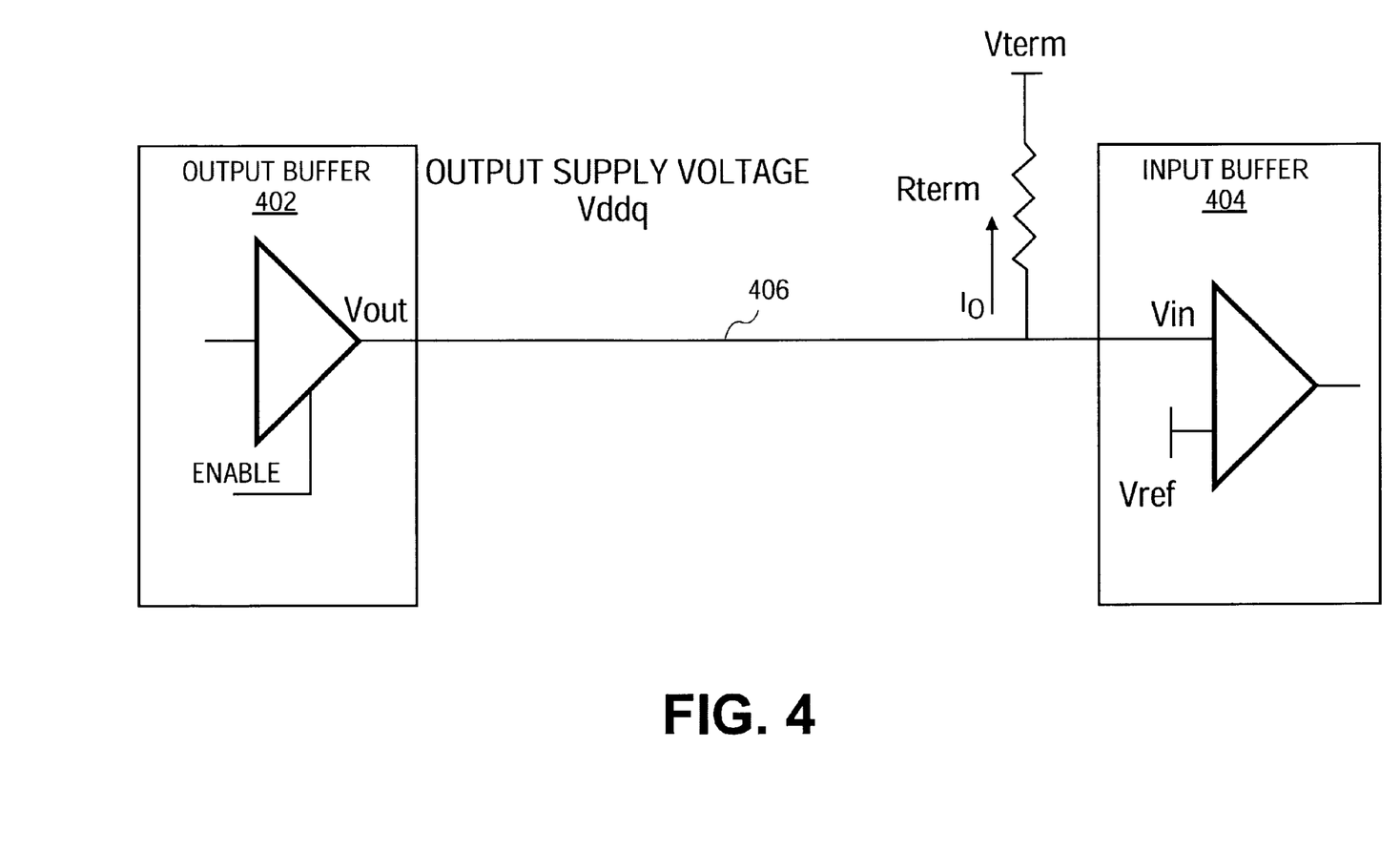
FIG. 4 illustrates an exemplary terminated interface to couple with a double data rate (DDR) synchronous dynamic random access memory (SDRAM) device.

FIG. 4 illustrates an exemplary terminated interface 400, comprising an output buffer 402 coupled with an input buffer 404 by an interface line 406. Interface line 406 is terminated to a termination voltage ($V_{TERM}$) through a termination resistance ($R_{TERM}$). As an example, output buffer 402 may drive a control signal on an output of memory controller 106 while input buffer 404 receives the control signal as an input of one of the memory devices of memory system 110. Interface line 406 may be a trace on a computer system's motherboard.

The SSTL interface operates on voltage levels between $V_{SS}$ and a supply voltage $V_{DDQ}$, with a switching point at a reference voltage $V_{REF}$, which may be approximately one-half of $V_{DDQ}$. Input buffer 404 may have defined voltage levels for a logic high and logic low of $V_{IH}(MIN)$ and $V_{IL}(MAX)$, respectively. Therefore, for one embodiment, output buffer 402 drives an output voltage $V_{OUT}$ onto interface line 406h between $V_{DDQ}$ and $V_{IH}(MIN)$ for a high logic level ($V_{OH}$), or between $V_{SS}$ and $V_{IL}(MAX)$, for a low logic level ($V_{OL}$).

As output buffer 402 drives interface line 406 high to $V_{OH}$, output buffer 402 sources a current of $I_O=(V_{OH}-V_{TERM})/R_{TERM}$ that flows through $R_{TERM}$ in the direction indicated in FIG. 4. As output buffer 402 drives interface line 406 low to $V_{OL}$, output buffer 402 sinks a current $I_O=(V_{TERM}-V_{OL})/R_{TERM}$ that flows through $R_{TERM}$ in the opposite direction of that indicated in FIG. 4.

While current flows through $R_{TERM}$, power is dissipated according to the following equations for logic levels of $V_{OH}$ and $V_{OL}$, respectively:

$$P_{TERM\_HI}=(V_{OH}-V_{TERM})^2/(R_{TERM})$$

$$P_{TERM\_LO}=(V_{TERM}-V_{OL})^2/(R_{TERM})$$

Assuming $V_{OH}>V_{TERM}$ and $V_{OL}<V_{TERM}$, power is dissipated through $R_{TERM}$ regardless of the voltage level driven by output buffer 402. Thus, a common method to prevent power dissipation through a terminated interface line, by driving the output to the same voltage level as $V_{TERM}$, is not available for an interface terminated to a voltage between logical high and logical low levels, such as the SSTL interface.

Output buffer 402 may have a first impedance state and a second impedance state. The first impedance state may correspond to a high impedance state, while the second impedance state may correspond to a normal operating impedance state. For one embodiment, output buffer 402 may be placed or maintained in a high impedance state by de-asserting a signal on an enable line. However, while input buffer 404 is enabled, output buffer 402 should drive interface line 406 to a valid SSTL logic level, greater than $V_{IH}(MIN)$ or less than $V_{IL}(MAX)$, to avoid a large current draw on input buffer 404, which may occur if input buffer 404 is enabled while $V_{IN}$ and $V_{REF}$ have insufficient differential voltage. It should be noted that if output buffer 402 is placed or maintained in the high impedance state, $V_{IN}$ may approximately equal $V_{TERM}$ because interface line 406 is terminated to $V_{TERM}$, which may approximately equal $V_{REF}$.

While input buffer 404 is disabled, however, output buffer 402 may be placed or maintained in a high impedance state by de-asserting a signal on an enable line, essentially creating an open circuit with no current flowing through $R_{TERM}$. With no current flowing, no power is dissipated through $R_{TERM}$.

Dynamic Driver Disabling

As previously described, when memory devices are placed or maintained in a low power state, some of the input buffers for the memory devices may be disabled. By disabling output buffers that drive memory controller outputs coupled with these disabled input buffers, power dissipated through terminated interface lines may be reduced. Therefore, for one embodiment, output buffer control circuit (OBCC) 316 controls the impedance state of output buffers for some outputs, such as address lines 332 and control lines 334. For one embodiment, OBCC 316 may comprise output buffers. For another embodiment, OBCC 316 may control enable lines to output buffers external to OBCC 316.

As illustrated, in one embodiment, OBCC 316 is integrated with memory controller 106. In another embodiment, however, OBCC 316 may be packaged as an external device, coupled between memory controller 106 and memory system 110.

Referring back to FIG. 2, for block 208, OBCC 316 places or maintains one or more output buffers having outputs coupled with a memory device accessed by the next memory request in the second impedance state. For block 209, PSCC 314 places or maintains the memory device accessed by the next memory request in the second power state. Note that output buffers should be enabled prior to the memory device transitioning to the second power state, in order to avoid the high current draw previously described that might occur if input buffers for any of the memory devices coupled with the outputs of the one or more output buffers were enabled.

For block 210, PSCC 314 places or maintains memory devices not performing a memory request in the first power state. Placing memory devices in the first power state when the memory devices are not performing a memory request helps reduce power consumption. For one embodiment, PSCC 314 may place or maintain memory devices in the second power state only when the memory devices are performing a memory request.

For block 212, OBCC 316 determines whether one or more memory devices coupled with outputs of one or more output buffers are in a first power state or a second power state. For one embodiment, OBCC 316 may monitor an internal copy of one or more control signals generated by memory controller 106 to place or maintain a memory device in the first power state or second power state.

For block 214, OBCC 316 places or maintains the one or more output buffers in the first impedance state, in response to determining each of the one or more memory devices is in the first power state. Hence, current consumption is reduced by the amount of current consumed through the interface lines coupled with the one or more outputs when driven to valid logic levels, which helps reduce overall power consumption.

For block 216, the next memory request is issued to memory system 110, to be performed therein. After the next memory request is performed by memory system 110, as illustrated in block 218, while there are memory requests in request buffer 304, the operations of blocks 207–216 are repeated.

For block 220, when request buffer 304 is empty, the one or more memory devices are placed or maintained in the first power state. Finally, for block 222, the one or more output buffers are placed or maintained in the first impedance state in response to determining each of the one or more memory devices is in the first power state. It should be noted that the one or more output buffers may have already been placed in the first impedance state for block 214, in which case they will be maintained in the first impedance state for block 222.

Dynamic Driver Disabling For DDR SDRAM Devices

For one embodiment, OBCC 316 may monitor a signal indicative of a CKE line shared among a common row of DDR SDRAM memory devices. If the signal is de-asserted, the common set of memory devices that share the CKE line are in the first power state.

For DDR SDRAM devices, the CKE signal is a synchronous signal. In order for a DDR SDRAM device to enter the low power state, the CKE signal must be sampled low on a rising edge of a clock (CK) signal. As an example, after the CKE signal for a memory row is sampled low, input buffers for devices in the row, except input buffers for CKE and CK signals are disabled. While CKE is de-asserted for the memory row, valid CK signals should be maintained for the memory row.

In order to avoid the previously described high current draw, it is important that DDR SDRAM devices are in the low power state with input buffers disabled before output buffers are disabled. Therefore, for one embodiment, OBCC 316 may determine that a CKE signal to a row of DDR SDRAM memory devices is de-asserted in one clock cycle, and wait until the next clock cycle to disable output buffers having outputs coupled with the row. This may be accomplished using internal copies of CKE signals that have been delayed one clock cycle, for example, by an internal flip-flop circuit.

Figure 5:
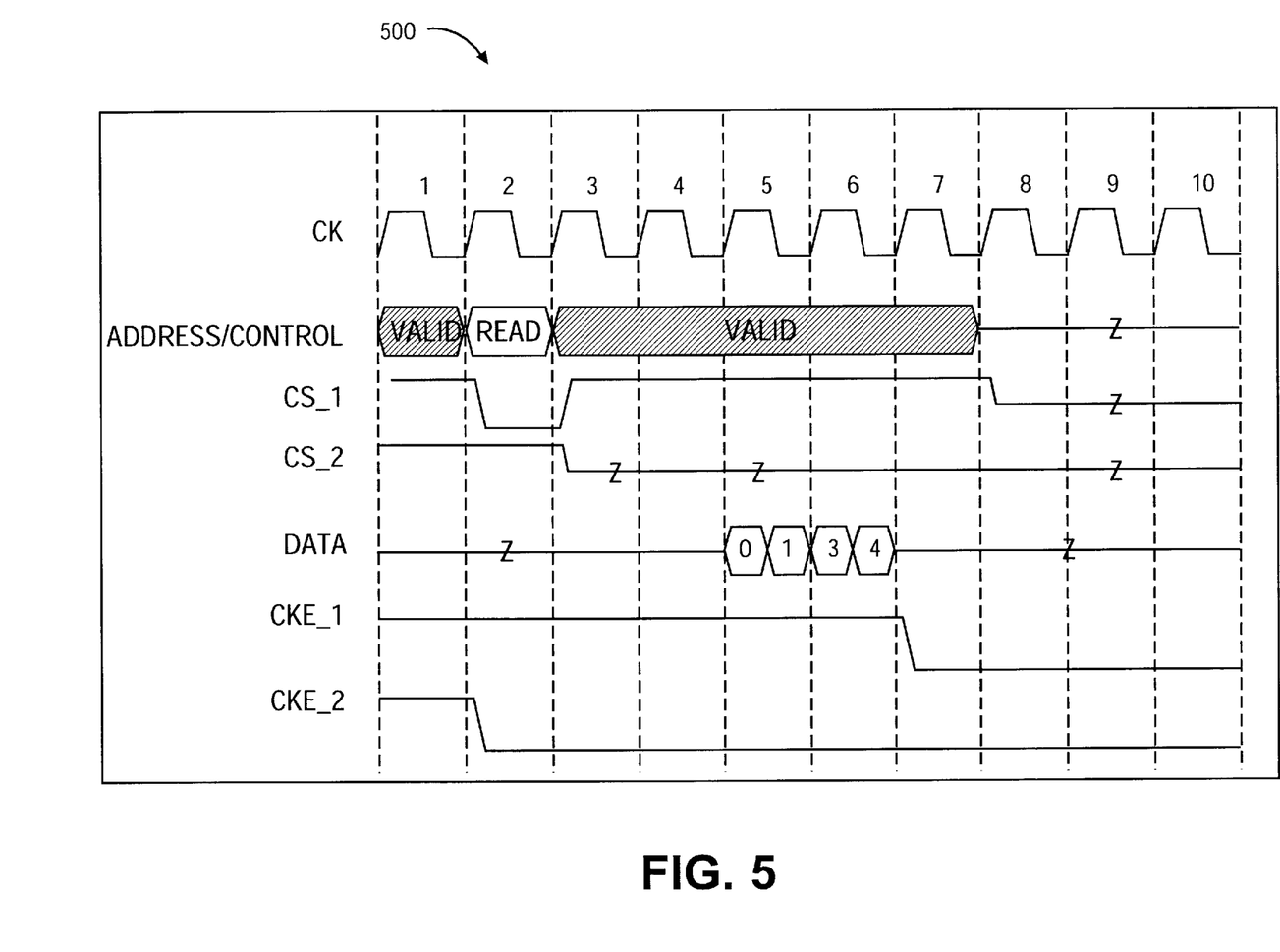
FIG. 5 illustrates a timing diagram for one embodiment of memory control with dynamic driver disabling suitable for DDR SDRAM devices.

Timing diagram 500 of FIG. 5 illustrates, for one embodiment, dynamic driver disabling for DDR SDRAM devices. Timing diagram 500 comprises timelines for a clock (CK) signal, address and control (ADDRESS/CONTROL) signals, chip select signals (CS_1 and CS_2), data signals, and clock enable signals (CKE_1 and CKE_2).

CKE_1 and CS_1 represent signals dedicated to a first row of DDR SDRAM memory devices, while CKE_2 and CS_2 represent signals dedicated to a second row of DDR SDRAM devices. Address, control, and data signals are shared among the two memory device rows. Interface signals driven by output buffers placed or maintained in the high impedance state are indicated by a -Z- notation on the timeline for the signal. While the diagram illustrates bus signals for only two rows of memory devices, it should be appreciated the present invention is not so limited.

In clock cycle 1, both CKE_1 and CKE_2 are asserted. Therefore, the output buffers for the illustrated output signals are enabled.

In clock cycle 2, CKE_2 is de-asserted as a READ request is issued to the first row of memory devices. As illustrated, the READ request is performed over the next four clock cycles.

In clock cycle 3, CKE_2 is sampled low, on the rising edge of CK, by the second row of memory devices so input buffers for the second row of memory devices are disabled. Because CKE_2 and CS_2 are dedicated to the second row of memory devices, the output buffer for CS_2 is placed or maintained in the high impedance state. Because address and control signals are also coupled with the first row of memory devices, which contains the memory device accessed by the READ request, output buffers for the address and control signals remain in the normal impedance state.

The READ request is completed in clock cycle 6. The illustrated READ request has a burst length of four. A READ request with a different burst length would require a different number of clock cycles to perform. As an example, a read request with a burst length of two would require one less clock cycle, while a read request with a burst length of eight would require two additional clock cycles.

In clock cycle 7, CKE_1 is de-asserted. Therefore, in clock cycle 8, CS_1 is placed or maintained in the high impedance state. Because both CKE_1 and CKE_2 are de-asserted, output buffers for the common set of address and control line outputs are placed or maintained in the high impedance state, as well.

As previously described, for DDR SDRAM devices, input buffers for CK signals are not disabled in the low power state. However, DDR SDRAM devices have a self-refresh mode in which input buffers for CK signals are disabled along with all other input buffers except input buffers for CKE signals. Therefore, for one embodiment, OBCC 316 may place or maintain output buffers for CK outputs in the high impedance state when a DDR SDRAM device is in self-refresh mode. For one embodiment, OBCC 316 monitors internal copies of signals generated on control lines 334 by memory controller 106 to determine when memory devices are placed in the self-refresh mode.

Typically, CK signals are generated by memory controller 106 with an internal phase lock loop (PLL) circuit. However, for one embodiment, CK signals to memory devices in memory system 110 are generated by an external PLL device. Output buffers for CK signal outputs may be placed or maintained in a high impedance state by de-asserting a signal to an output enable (OE) input to the PLL device. Therefore, one embodiment of OBCC 316 de-asserts an OE signal to a PLL device to place or maintain output buffers for CK signals in the high impedance state.

While illustrated as a component in a mobile computer system 100, memory controller 106 may be used to help reduce power consumption in other types of computer systems, as well. Memory controller 106 may also be used in other types of battery-powered devices, such as a personal digital assistant (PDA). In such devices, memory controller 106 may help extend battery life by placing memory devices in a low power state when they are not being accessed, and by disabling drivers for outputs coupled with the memory devices.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A method comprising:
   determining whether one or more memory devices coupled with each output of one or more output buffers by a terminated bus are in a first power state or a second power state, each output buffer having a first impedance state and a second impedance state; and
   placing or maintaining the one or more output buffers in the first impedance state in response to determining each of the one or more memory devices is in the first power state.

2. The method of claim 1, comprising placing or maintaining the one or more output buffers in the second impedance state prior to placing any of the one or more memory devices in the second power state.

3. The method of claim 1, wherein determining whether the one or more memory devices are in the first power state or the second power state comprises monitoring one or more signals indicative of one or more clock enable signals to the one or more memory devices.

4. The method of claim 1, wherein a common set of the one or more memory devices is coupled with the outputs of a common set of the one or more output buffers, and the method comprises:
   determining whether each of the common set of memory devices is in the first power state or the second power state; and
   placing or maintaining in the first impedance state the common set of output buffers in response to determining each of the common set of memory devices is in the first power state.

5. The method of claim 4, comprising placing or maintaining the common set of output buffers in the second impedance state prior to placing any of the common set of memory devices in the second power state.

6. The method of claim 1, comprising placing or maintaining the one or more memory devices in the first power state when the one or more memory devices are not performing a memory request.

7. An apparatus comprising:
   (a) one or more output buffers having one or more outputs to couple with one or more memory devices by a terminated bus, each memory device having a first power state and a second power state, each output buffer having a first impedance state and a second impedance state; and
   (b) an output buffer control circuit to:
      (i) determine whether the one or more memory devices are in the first power state or the second power state, and
      (ii) place or maintain the one or more output buffers in the first impedance state in response to determining each of the one or more memory devices is in the first power state.

8. The apparatus of claim 7, comprising a power state control circuit to place the one or more memory devices in the second power state, wherein the output buffer control circuit places or maintains the one or more outputs buffers in the second impedance state prior to the power state control circuit placing the one or more memory devices in the second power state.

9. The apparatus of claim 7, wherein the output buffer control circuit determines whether the one or more memory devices are in the first power state or the second power state by monitoring one or more signals indicative of one or more clock enable signals to the one or more memory devices.

10. The apparatus of claim 7, wherein an output of at least one of the one or more ouput buffers is coupled with a chip select line output.

11. The apparatus of claim 7, wherein the output buffer control circuit places the one or more output buffers in the first impedance state at least one clock cycle after determining each of the one or more memory devices is in the first power state.

12. The apparatus of claim 7, wherein a common set of the one or more memory devices is coupled with the outputs of a common set of the one or more output buffers, and the output buffer control circuit:
   determines whether each of the common set of memory devices is in the first power state or the second power state; and
   places or maintains the common set of outputs buffers in the first impedance state in response to determining each of the common set of memory devices is in the first power state.

13. The apparatus of claim 12, comprising a power state control circuit to place the common set of memory devices in the second power state, and the output buffer control circuit places or maintains the common set of output buffers in the second impedance state prior to the power state control circuit placing the common set of memory devices in the second power state.

14. The apparatus of claim 12, wherein the outputs of one or more of the common set of output buffers are coupled with one or more address line outputs.

15. The apparatus of claim 7, comprising a power state control circuit to place or maintain the one or more memory devices in the first power state when the one or more memory devices are not performing a memory request.

16. The apparatus of claim 7, wherein the output buffer control circuit determines whether the one or more memory devices are in a self-refresh mode and places or maintains in the first impedance state output buffers for clock signal outputs to the one or more memory devices in response to determining the one or more memory devices are in the self-refresh mode.

17. A system comprising:
   (a) one or more memory devices having a first power state and a second power state;
   (b) a terminated bus; and
   (c) a memory controller comprising:
      (i) one or more output buffers each having an output to couple with the one or more memory devices, each output buffer having a first impedance state and a second impedance state, and
      (ii) an output buffer control circuit to determine whether the one or more memory devices are in the first power state or the second power state and to place or maintain the one or more output buffers in the first impedance state in response to determining each of the one or more memory devices is in the first power state.

18. The system of claim 17, wherein the memory controller comprises a power state control circuit to place the one or more memory devices in the second power state, and the output buffer control circuit places or maintains the one or more output buffers in the second impedance state prior to the power state control circuit placing the one or more memory devices in the second power state.

19. The system of claim 17, wherein the output buffer control circuit determines whether the one or more memory devices are in the first power state or the second power state by monitoring one or more signals indicative of one or more clock enable signals to the one or more memory devices.

20. The system of claim 17, wherein the output of at least one of the one or more outputs buffers is coupled with a chip select line output.

21. The system of claim 17, wherein the output buffer control circuit places the one or more output buffers in the first impedance state at least one clock cycle after determining each of the one or more memory devices is in the first power state.

22. The system of claim 17, wherein a common set of the one or more memory devices is coupled with the outputs of a common set of the one or more output buffers, and the output buffer control circuit:
   determines whether each of the common set of memory devices is in the first power state or the second power state; and
   places or maintains the common set of output buffers in the first impedance state in response to determining each of the common set of memory devices is in the first power state.

23. The system of claim 22, wherein the memory controller comprises a power state control circuit to place the common set of memory devices in the second power state, and the output buffer control circuit places or maintains the common set of output buffers in the second impedance state prior to the power state control circuit placing any of the common set of memory devices in the second power state.

24. The system of claim 22, wherein the outputs of one or more of the common set of output buffers are coupled with one or more address line outputs.

25. The system of claim 17, wherein the memory controller comprises a power state control circuit to place or maintain the one or more memory devices in the first power state when the one or more memory devices are not performing a memory request.

26. The system of claim 17, wherein the one or more memory devices are double data rate synchronous dynamic random access memory devices.

27. The system of claim 17, wherein the one or more memory devices comprise one or more sets of one or more double data rate synchronous dynamic random access memory devices, each set packaged as a dual inline memory module.

28. The system of claim 17 wherein the output buffer control circuit determines whether the one or more memory devices are in a self-refresh mode and places or maintains in the first impedance state output buffers having outputs coupled with one or more clock signal outputs to the one or more memory devices in response to determining the one or more memory devices are in the self-refresh mode.

* * * * *

UNITED STATES PATENT AND TRADEMARK OFFICE
CERTIFICATE OF CORRECTION

PATENT NO.     : 6,510,099 B1
DATED          : January 21, 2003
INVENTOR(S)    : Wilcox et al.

It is certified that error appears in the above-identified patent and that said Letters Patent is hereby corrected as shown below:

<u>Column 6,</u>
Line 6, delete "406h", insert -- 406 --.

Signed and Sealed this

Seventeenth Day of June, 2003

JAMES E. ROGAN
*Director of the United States Patent and Trademark Office*